(12) United States Patent
Nagurny et al.

(10) Patent No.: US 6,894,897 B1
(45) Date of Patent: May 17, 2005

(54) STRUCTURE-BORNE NOISE ISOLATION TECHNIQUE AND APPARATUS FOR FANS AND BLOWERS

(75) Inventors: Nicholas J. Nagurny, Manassas, VA (US); Lance William Greer, Nokesville, VA (US); Stephen Zajkowski, Culpepper, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/733,641

(22) Filed: Dec. 12, 2003

(51) Int. Cl.[7] ............................................... H05K 7/20
(52) U.S. Cl. .................. 361/695; 361/694; 174/15.1; 165/122; 415/213.1; 415/214.1; 415/119
(58) Field of Search ................................ 361/690, 694, 361/695; 174/15.1, 16.1, 16.3; 165/80.3, 104.33, 122; 415/119, 213.1, 214.1

(56) References Cited

U.S. PATENT DOCUMENTS

| 4,568,243 A | 2/1986 | Schubert et al. |
| 4,807,718 A | 2/1989 | Lotz |
| 5,316,423 A | 5/1994 | Kin |
| 6,309,192 B1 | 10/2001 | Litvin |
| 6,324,731 B1 | 12/2001 | Pliml, Jr. |
| 6,351,380 B1 * | 2/2002 | Curlee et al. ............... 361/695 |
| 6,478,838 B2 * | 11/2002 | McSweeney et al. ......... 55/467 |
| 6,692,226 B1 * | 2/2004 | Cheng ........................ 415/119 |

FOREIGN PATENT DOCUMENTS

| JP | 05168188 A | 2/1993 |
| JP | 10110699 A | 4/1996 |

* cited by examiner

*Primary Examiner*—Boris Chérvinsky
(74) *Attorney, Agent, or Firm*—Mark A. Wurm

(57) ABSTRACT

A system and method decreases the transmission of structure-borne noise by cooling fans to electronic components and structurally integrated enclosures for the electronic components. The system has a machined isolation plate that fits onto a rear plate on the structurally integrated enclosure. The cooling fans are fitted onto the opposite side of the isolation plate. Fitted between the isolation plate and the rear plate, and/or the isolation plate and the cooling fans are soft elastomeric isolators. These isolators dampen and prevent the transmission of structure-borne noise from the cooling fans to the electronic components and the structurally integrated enclosure. This dampening is advantageous on platforms in which stealth is desired, such as on submarines.

18 Claims, 4 Drawing Sheets

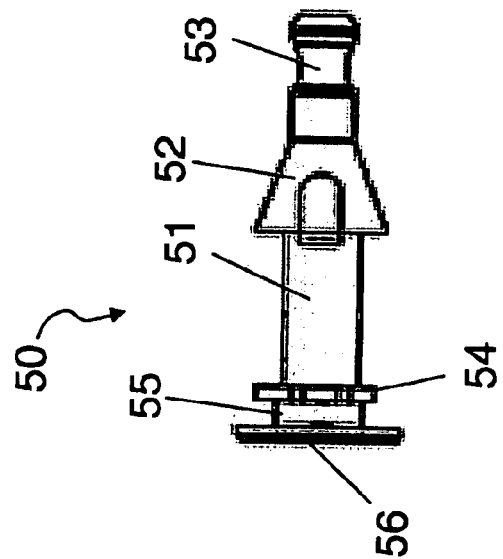
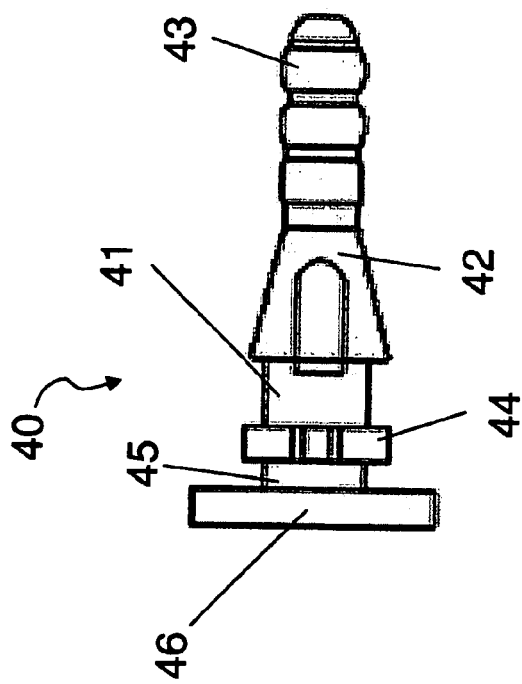

STRUCTURE-BORNE NOISE ISOLATION TECHNIQUE AND APPARATUS FOR FANS AND BLOWERS

This invention was made with government support under contract number N00024-96-6226 awarded by the Department of the Navy. The government may have certain rights in this invention.

FIELD OF THE INVENTION

The present invention relates to isolating and minimizing the transmission of structure-borne noise, and in particular, structure-borne noise from fans and blowers used in connection with the convective cooling of electronic components.

BACKGROUND OF THE INVENTION

It is well known that electronic components, when they are energized and consuming power, produce heat that in most instances must be actively removed by means other than simple radiation-dissipation to the surrounding environment. Additionally, increasing rates of data throughput and bandwidth may result in higher power densities, thereby increasing the amount of heat that is produced and that must be removed.

Many industrial and military applications use fans and/or blowers to convectively remove the heat produced by energy consuming electronic components. These fans are normally hard mounted onto the chassis or housing that contains the electronic components. Mounting the fans on the housing however can create noise problems, since the vibration or structure-borne noise from the operating fans may be transmitted to the electronic components, the housing for the electronic components, and the surrounding environment. This is particularly the case for certain fans, such as COTS fans, which experience excessive vibration that causes increases in structure-borne noise. Indeed, any small high speed fan produces an excessive structure-borne noise signature.

In some applications, such as military submarine platforms in which stealth is required, it is critical to prevent the transmission of this structure-borne noise from the fans to the surrounding environment. Consequently, military standards such as MIL-STD 740-2 detail the measurements and limits of structure-borne vibratory noise. Therefore, whether it is a military application or an industrial application, it is desirable to isolate as much as possible the structure-borne noise of such fans.

However, as with many problems that confront engineers, there are trade-offs that must be considered in addressing or solving a particular problem. In the art of convectively cooling electronic components for example, there are trade-offs in the design of electronic components and the structurally integrated enclosures (SIE) that house those electronic components. One such trade-off is designing for both maximal thermal performance and noise damping. That is, systems and designs that permit excellent thermal removal may exacerbate, or at least not diminish, vibratory noise of the system. For example, gaskets used in prior art systems tend to actually reduce isolation, and may also introduce short circuit paths for cooling air to escape before it passes into the component housing and flows over the electronic components. Moreover, prior art gaskets do not dampen structure-borne noise all that well, at least not without a substantial redesign of the component housing.

SUMMARY OF THE INVENTION

A preferred embodiment of the present invention is a system that isolates and minimizes the transmission of structure-borne noise, while at the same time maintaining the thermal removal capability of the system. The system has an isolation plate with one or more holes machined and bored therein to receive one or more soft elastomeric isolators. The isolators have a base, a shaft, a tapered cone, and a grooved shaft. In a preferred embodiment, one set of isolators attaches a fan or blower to the isolation plate, and a second set of isolators attaches the isolation plate to a rear plate of a chassis for electronic components. The soft elastomeric isolators isolate the fan from the rest of the system, and dampen the transmission of structure-borne noise from the fan to the rest of the system. Additionally, because the isolation plate is machined, it fits tightly with both the fan and the rear plate of the chassis. This tight fit prevents short circuit paths of air flow from the fan to the chassis, and consequently there is little loss of cooling air in the system.

It is therefore an object of a preferred embodiment of the present invention to isolate the electronic components of a system, thereby dampening or isolating the structure-borne noise of that system, and hence reducing the transmission of structure-borne noise within and throughout the system.

BRIEF DESCRIPTION OF THE DRAWINGS

FIGS. 2a and 2b illustrate examples of isolators that may be used in connection with the present invention.

DETAILED DESCRIPTION OF THE INVENTION

The present invention is a system and method for isolating and reducing the transmission of vibratory or structure-borne noise, especially structure-borne noise associated with fans and/or blowers that are used to convectively cool electronic components.

Figure 1:
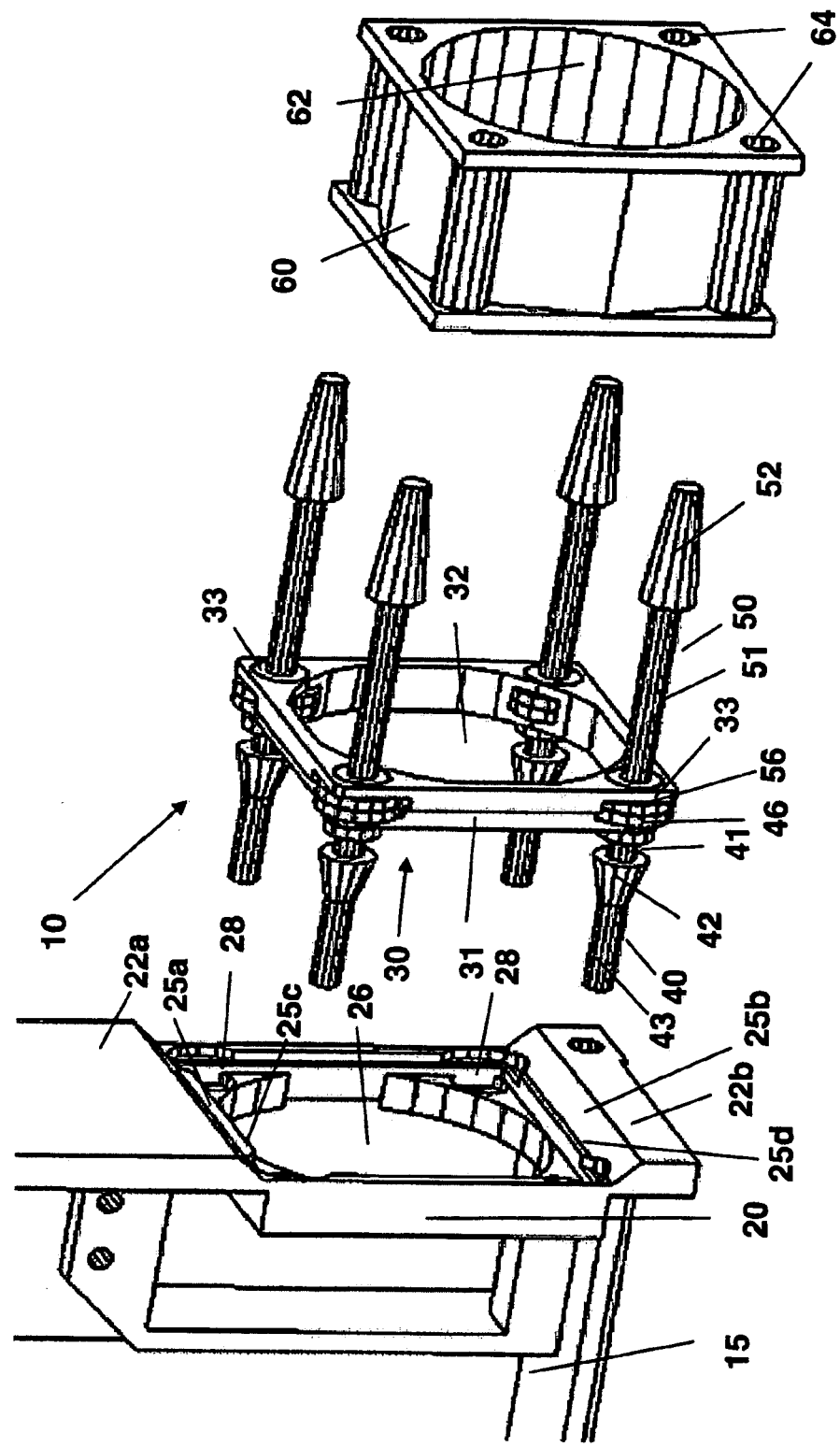
FIG. 1 is an exploded view of a preferred embodiment of the present invention.

FIG. 1 illustrates, in an exploded view, the system 10 of the present invention. The bowels of the system 10 are an isolation (or adaptor) plate 30 that can be manufactured out of several different types of material including machined aluminum (AL 6061), steel, stainless steel, and sheet metal. The preferred material for the isolation plate 30 is either machined aluminum or stainless steel. The isolation plate 30 consists of a frame 31 and a large aperture 32 formed by the frame 31. The frame 31 is machined to fit other components of the system 10, which provides a compact design and a decoupling effect between different components of the system. The frame 31 also has one or more holes bored through it. As illustrated in the preferred embodiment of FIG. 1, there are four holes 33 bored into the isolation plate frame 31.

FIGS. 2a and 2b illustrate isolators 40 and 50. Isolators 40 and 50 are used in connection with isolation plate 30 to dampen and isolate the vibratory or structure-borne noise in the system 10. Isolator 40 has a main shaft 41, a cone shaped (or post-style or Christmas tree shaped) stopper 42, a grooved shaft 43, a shaft separator 44, a minor shaft 45, and a base 46. Similarly, isolator 50 has a main shaft 51, a cone shaped (or post-style or Christmas tree shaped) stopper 52, a grooved shaft 53, a shaft separator 54, a minor shaft 55, and a base 56. As can be seen from FIGS. 2a and 2b, the isolators 40 and 50 are quite similar, with the major difference being the length of the main shafts 41 and 51. As will be seen infra, the difference in the main shaft lengths accommodates the different depths of different system components. In a preferred embodiment, the isolators 40 and 50 are durometer post-style elastomeric isolators, such as model numbers F-344-1 and NCP16375 from the EAR Specialty Composites Corporation of Indianapolis, Ind. See http://www.earsc.com/grommets.asp?bid=388. The isolators 40 and 50 can be made out of any elastomeric material, but a preferred material is a silicone-rubber composite.

Referring back to FIG. 1, the isolators 40 and 50 are shown as employed in the present invention. In a preferred embodiment of the present invention, two isolators, such as isolators 40 and 50 in FIG. 1, are positioned in the isolator plate 30. In this preferred embodiment, the bases 46 and 56 are either in contact or close proximity to each other, and the tapered cones 42 and 52 are on opposite sides of the isolation plate 30. The bases 46 and 56, the minor shafts 45 and 55, and the shaft separators 44 and 54, function to hold the isolators 40 and 50 properly positioned in the isolation plate 30.

Figure 4:
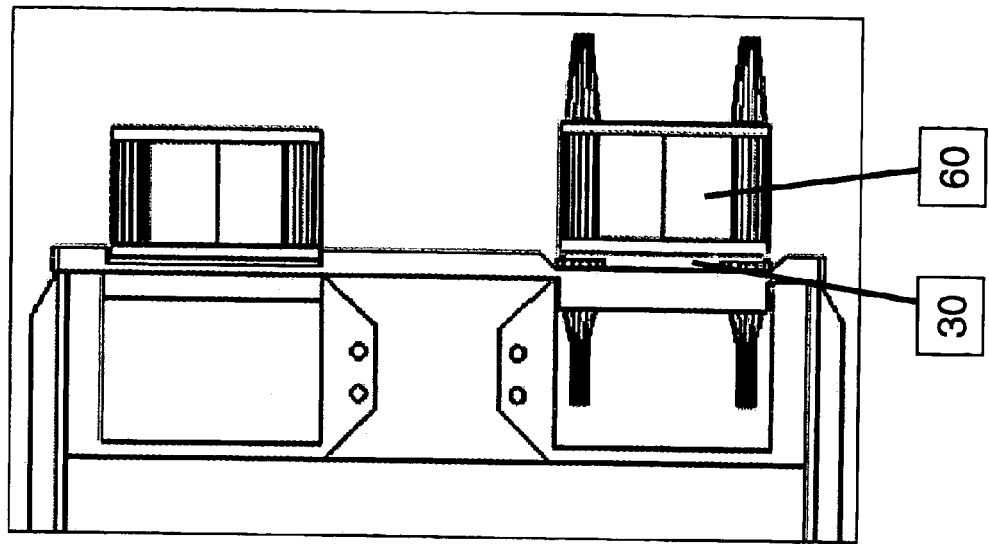
FIG. 4 is a side view of the present invention mounted onto a chassis for electronic components.
Figure 3:
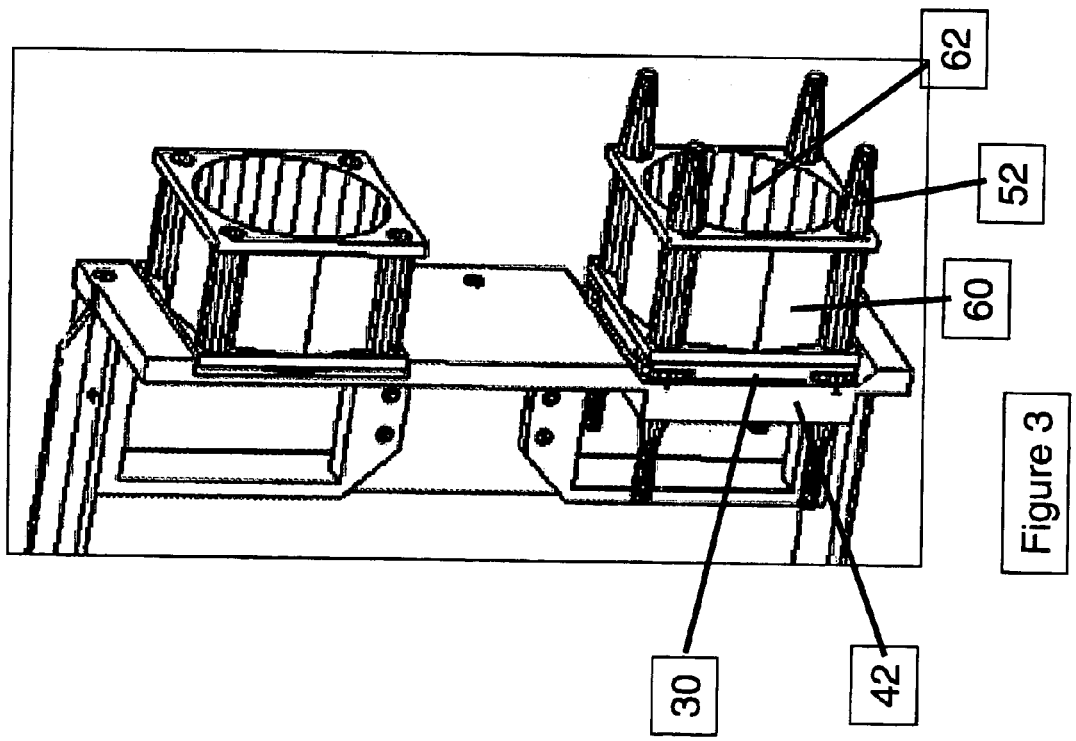
FIG. 3 is a perspective view of the present invention mounted onto a chassis for electronic components.

FIG. 1 further shows a fan or blower 60 with blades 62. The outer housing of the fan 60 has holes 64 which receive the isolators 50. The isolators 50 are pushed into the holes 64, and pulled through the holes 64 by grasping the grooved shaft 53. After installation, the grooved shaft 53 may be cut off and removed leaving the cone shaped stopper 52, or the grooved shaft 53 may be left on the isolator 50. The fan 60 is easily mounted on the isolators 50 because of the tapered isolator cone 52 and the long main shaft 51. After the isolator 50 is pulled through the holes 64 so that the cone 52 has completely penetrated through the housing of the fan 60, release of the grooved shaft 53 permits contraction of the stretched isolator 50 and the wide or base end of the tapered isolator cone 52 exerts pressure against the housing of the fan 60, and causes the isolation plate 30 and the fan 60 to be held tightly together. FIG. 3 shows a perspective view of a fan 60 fully mounted on an isolation plate 30, and FIG. 4 shows a side view of the fan 60 mounted on the isolation plate 30. As can be seen in FIGS. 3 and 4, more than one fan 60 may be mounted on a chassis.

FIG. 1 further illustrates a chassis or structurally integrated enclosure (SIE) 15 for housing electronic components. Such a chassis 15 is usually constructed of sheet metal. The chassis 15 has formed in it or mounted on it a rear plate 20. Rear plate 20 has facings 22a and 22b, and recessed shoulders 25a and 25b. The recessed shoulders 25 form a pocket 26, the pocket 26 having a depth roughly equal to the distance between the plane formed by facings 22a and 22b and the plane formed by opposite ends 25c and 25d of the shoulders 25a and 25b. The isolation plate 30 is machined and counter-bored such that it sets into the pocket 26 and mates with the rear plate 20. Such fitting minimizes or eliminates air gaps between the isolation plate 30 and the chassis 15. With reduced or eliminated air gaps, the existence of a short circuit path for convective air to escape is minimized, and a greater volume of air will flow past the point of connection of the isolation plate 30 and rear plate 20 and into the chassis 15.

On the rear plate 20 are counter-bored holes 28 that receive the isolators 40. Specifically, the tapered end of the cone-shaped stopper 42 is oriented towards and mates with the respective counter-bored holes 28 on the rear plate 20. As can be seen in FIGS. 3 and 4, the cone-shaped stopper 42 holds the isolation plate 30 flush with rear plate 20, and cone-shaped stopper 52 holds the fan 60 flush with isolation plate 30.

While the invention has been described as having isolators 50 and 40 positioned between the isolation plate 30 and the fan 60, and the isolation plate 30 and the rear plate 20 respectively, other embodiments may use isolators 40 without isolators 50 and vice versa. On embodiments in which one set of the isolators 40 or 50 are not present, the fan 60 and chassis 15 are mounted directly onto the isolator plate 30 by means of attachment well known in the art. When only one set of isolators is used, it is preferred to use isolators 40 which separate the rear plate 20 from the isolation plate 30. And when only one set of isolators is used, it is preferred to use sandwich type isolators, such as model number MF-100-UC04-H from the EAR Corporation of Indianapolis, Ind., which are illustrated in FIG. 5.

Figure 5:
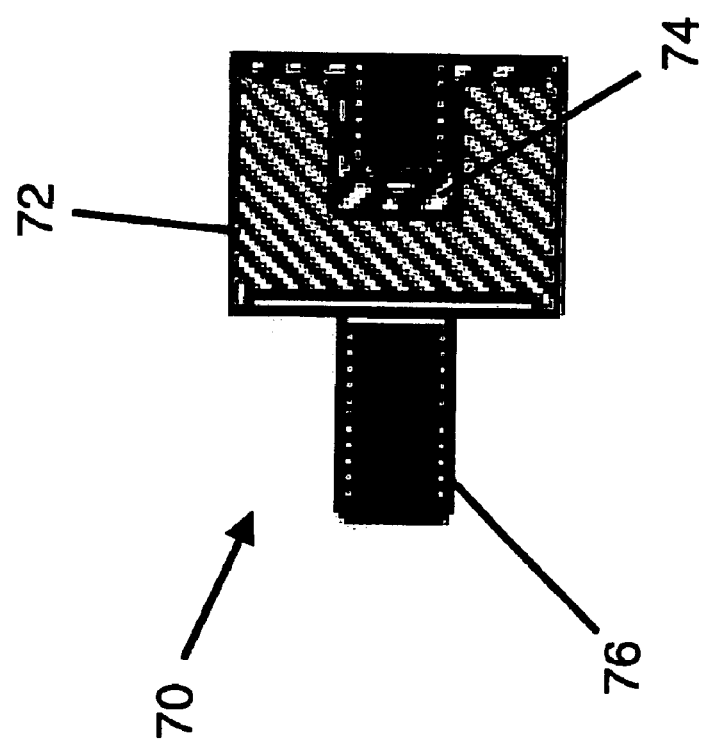
FIG. 5 illustrates a sandwich mount isolator that may be used in connection with the present invention.

FIG. 5 shows a sandwich type isolator mount 70. It is made up of an isolator body 72, a threaded cavity 74, and a threaded post 76. The isolator body is made of an elastomeric substance. In one embodiment, threaded post 76 is positioned in the holes 33 of isolation plate frame 31, and threaded cavity 74 receives a threaded post that protrudes from the rear plate 20. As explained supra, the soft elastomeric isolator 70 dampens and isolates the structure-borne noise in the system.

The isolation plate 30 and isolators 40, 50 and/or 70 isolate the fan 60 from the rest of the system 10. This isolation serves to dampen the vibration of the fans 60, which in turn reduces the structure-borne noise of the fans. This reduction in structure-borne noise is an advantageous feature in systems where stealth is required such as in submarines. The system 10 of the present invention experiences a 15–30 dB reduction in structure-borne noise (related to 10 micro-meters per second squared) over prior art systems that do not have the isolators of the present invention. While the system 10 of the present invention appreciably reduces the level of structure-borne noise, the isolation plate 30, isolators 40, 50 and 70, and rear plate 20 of the preferred embodiment of the present invention also reduce the level of acoustic noise of the system caused by the fans 60. And while the system 10 of the present invention is able to reduce both the structure-borne noise and acoustic noise, it does not impact the airflow of the system, i.e. there is no or very little loss of cooling air as it travels from the fan 60, through the isolation plate 30 and the rear plate 20, and into the chassis 15. One reason why there is very little loss of convective air is that the isolation plate 30 and rear plate 20 are machined to fit precisely and do not have any short circuit paths for the air flow.

While the invention has been described in its preferred embodiment, it is to be understood that the words used are words of description rather than limitation and that changes may be made within the purview of the appended claims without departing from the true scope and spirit of the invention in its broader aspects. For example, while the technique for damping and isolating vibratory and structure-borne noise has been discussed in connection with the convective cooling of electronic components by fans, the technique of the present invention could be applied to many other situations that require the isolation of structure borne noise.

What is claimed is:

1. A system to reduce the transmission of structure-borne noise of a convective cooling system for electronic components housed in a chassis comprising:
   an isolation plate, said isolation plate comprising a frame with one or more holes bored therein;
   a rear plate, said rear plate having one or more holes bored therein;

a fan to convectively cool said electronic components, said fan having holes bored therein; and one or more isolators, said isolators comprising a base, a shaft, and a cone-shaped stopper;

wherein said isolators are positioned in said holes of said isolation plate, said holes of said rear plate, and said holes of said fan, such that said isolators connect said isolation plate, said rear plate, and said fan together;

and further wherein said isolators prevent said transmission of structure-borne noise.

2. The system to reduce structure-borne noise of a convective cooling system for electronic components according to claim 1, wherein said rear plate comprises recessed shoulders forming a pocket, said pocket receiving and mating with said isolation plate.

3. The system to reduce structure-borne noise of a convective cooling system for electronic components according to claim 2, wherein said isolation plate sets into said rear plate such that no short circuit path exists for air traveling from said fan, through said isolation plate, and into said rear plate.

4. The system to reduce structure-borne noise of a convective cooling system for electronic components according to claim 1, wherein said isolators further comprise a grooved shaft attached to said cone-shaped stopper.

5. The system to reduce structure-borne noise of a convective cooling system for electronic components according to claim 1, wherein said isolators comprise an elastomeric material.

6. The system to reduce structure-borne noise of a convective cooling system for electronic components according to claim 5, wherein said elastomeric material is a silicone-rubber composition.

7. The system to reduce structure-borne noise of a convective cooling system for electronic components according to claim 1, wherein said isolation plate comprises aluminum or stainless steel.

8. An apparatus for isolating structure-borne noise of a cooling system for electronic components in a structurally integrated enclosure comprising:

an isolation plate, said isolation plate comprising a frame with one or more holes bored therein;

a rear plate attached to said structurally integrated enclosure, said rear plate comprising a pocket for reception and mating of said isolation plate;

a fan to convectively cool said electronic components, said fan having holes bored therein; and one or more isolators, said isolators comprising a base, a shaft, and a post-style stopper;

wherein said one or more isolators connect said isolation plate to said rear plate;

and further wherein said one or more isolators dampen the transmission of said structure-borne noise.

9. The apparatus for isolating structure-borne noise according to claim 8, wherein said one or more isolators connect said isolation plate to said fan.

10. The apparatus for isolating structure-borne noise according to claim 8, wherein said pocket of said rear plate is formed by recessed shoulders, and further wherein said pocket receives and mates with said isolation plate.

11. The apparatus for isolating structure-borne noise according to claim 8, wherein said isolation plate sets into said rear plate such that no short circuit path exists for air traveling from said fan, through said isolation plate, and into said rear plate.

12. The apparatus for isolating structure-borne noise according to claim 8, wherein said isolators further comprise a grooved shaft attached to said cone-shaped stopper.

13. The apparatus for isolating structure-borne noise according to claim 8, wherein said isolators comprise an elastomeric material.

14. The apparatus for isolating structure-borne noise according to claim 13, wherein said elastomeric material is a silicone-rubber composition.

15. The apparatus for isolating structure-borne noise according to claim 8, wherein said isolation plate comprises aluminum or stainless steel.

16. The apparatus for isolating structure-borne noise according to claim 8, wherein said isolators comprise sandwich type isolators.

17. A system to dampen the transmission of structure-borne noise comprising:

an isolation plate, said isolation plate comprising a machined frame with holes bored therein;

a first component of said system comprising holes bored therein, said first component generating structure-borne noise;

a second component of said system comprising holes bored therein;

one or more isolators, said isolators comprising a base, a shaft, and a cone-shaped stopper;

wherein said isolators are positioned in said holes of said isolation plate, said holes of said first component, and said holes of said second component;

and further wherein said isolators dampen the transmission of said structure-borne noise from said first component to said second component.

18. An apparatus for isolating structure-borne noise of a cooling system for electronic components in a structurally integrated enclosure comprising:

an isolation plate, said isolation plate comprising a frame with one or more holes bored therein;

a rear plate attached to said structurally integrated enclosure, said rear plate comprising a pocket for reception and mating of said isolation plate;

a fan to convectively cool said electronic components, said fan having holes bored therein; and one or more isolators, said isolators comprising a base, a shaft, and a post-style stopper;

wherein said one or more isolators connect said isolation plate to said fan;

and further wherein said one or more isolators dampen the transmission of said structure-borne noise.

* * * * *